(12) United States Patent
Sun et al.

(10) Patent No.: US 12,446,427 B2
(45) Date of Patent: Oct. 14, 2025

(54) DISPLAY SUBSTRATE AND MANUFACTURING METHOD THEREFOR, DISPLAY PANEL, AND DISPLAY DEVICE

(71) Applicant: BOE Technology Group Co., Ltd., Beijing (CN)

(72) Inventors: Li Sun, Beijing (CN); Zhongyuan Wu, Beijing (CN); Pan Xu, Beijing (CN); Hongli Wang, Beijing (CN); Kaihong Ma, Beijing (CN); Huaiting Shih, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 428 days.

(21) Appl. No.: 18/022,525

(22) PCT Filed: Mar. 17, 2022

(86) PCT No.: PCT/CN2022/081465
§ 371 (c)(1),
(2) Date: Feb. 22, 2023

(87) PCT Pub. No.: WO2023/273423
PCT Pub. Date: Jan. 5, 2023

(65) Prior Publication Data
US 2024/0040897 A1    Feb. 1, 2024

(30) Foreign Application Priority Data

Jun. 30, 2021   (CN) .......................... 202110736015.4

(51) Int. Cl.
*H10K 59/10*    (2023.01)
*H10K 59/12*    (2023.01)
(Continued)

(52) U.S. Cl.
CPC ....... *H10K 59/221* (2023.02); *H10K 59/1201* (2023.02); *H10K 59/80517* (2023.02); *H10K 71/00* (2023.02)

(58) Field of Classification Search
CPC ....................................................... H10K 59/80
See application file for complete search history.

(56) References Cited

U.S. PATENT DOCUMENTS 5,703,436 A * 12/1997 Forrest .................... G09F 9/335
257/E33.056
5,949,186 A   9/1999 Nagayama et al.
(Continued)

FOREIGN PATENT DOCUMENTS

| CN | 101911832 A | 12/2010 |
| CN | 111584564 A | 8/2020 |
| WO | 2021005434 A1 | 1/2021 |

OTHER PUBLICATIONS

International Search Report for PCT/CN2022/081465 Mailed May 31, 2022.
European Search Report for 22831254.2 Mailed Apr. 3, 2024.

*Primary Examiner* — Evren Seven
(74) *Attorney, Agent, or Firm* — Ling Wu; Stephen Yang; Ling and Yang Intellectual Property

(57) ABSTRACT

A display substrate includes a light-emitting structure layer provided on a base; the light-emitting structure layer includes an anode layer, a first film layer group, and a second film layer group that are sequentially stacked; the anode layer includes one or more anodes; the first film layer group includes at least one film layer located between an anode and a cathode in an OLED device; the second film layer group includes a cathode, and at least one film layer located between the anode and the cathode in the OLED device; the orthographic projection of the second film layer group on the base includes the orthographic projection of the first film
(Continued)

layer group on the base, an overlapping portion of all film layers in the first film layer group serves as a first portion of the first film layer group.

20 Claims, 4 Drawing Sheets

(51) Int. Cl.
*H10K 59/80* (2023.01)
*H10K 71/00* (2023.01)

(56) References Cited

U.S. PATENT DOCUMENTS

| | | |
|---|---|---|
| 2008/0036374 A1 | 2/2008 | Okano |
| 2012/0074397 A1 | 3/2012 | Okumoto |
| 2015/0060823 A1 | 3/2015 | Furuie |
| 2015/0123108 A1 | 5/2015 | Uda |
| 2022/0246694 A1 | 8/2022 | Watanabe et al. |

\* cited by examiner

DISPLAY SUBSTRATE AND MANUFACTURING METHOD THEREFOR, DISPLAY PANEL, AND DISPLAY DEVICE

CROSS-REFERENCE TO RELATED APPLICATIONS

The present application is a U.S. National Phase Entry of International Application PCT/CN2022/081465 having an international filing date of Mar. 17, 2022, which claims priority of Chinese Patent Application No. 202110736015.4 filed to the CNIPA on Jun. 30, 2021 and entitled "Display Substrate and Manufacturing Method Therefor, and Display Device", the contents of the above-identified applications should be construed as being hereby incorporated by reference in their entirety.

TECHNICAL FIELD

The present disclosure relates to, but is not limited to, the field of display technology, and more particularly to a display substrate, a manufacturing method therefor, and a display device.

BACKGROUND

In a light emitting structure layer of some organic light emitting diode (OLED) display devices, a film layer located between an anode and a cathode is formed by an evaporation process, during the evaporation process, a metal mask is used to expose a region of a substrate where the material needs to be deposited to vapor of the evaporation material, and shield a region where the evaporation materials do not need to be deposited, therefore, a film layer with a same pattern as an opening of the mask can be formed on the substrate, and corresponding film layers can be deposited at the same position sequentially according to a film layer structure of the OLED device, finally a stacked structure of the light emitting OLED device and a light emitting region with a corresponding shape (which may be an equivalent pattern formed by arranging multiple OLED devices) on the substrate are formed. However, as shown in FIG. 1, for shaped light emitting regions 2' with some shapes on the substrate 1', such as a shape with complex edge, greatly varying curvature and no symmetry, and a tongue shape, a ring shape and other similar shapes, it is difficult to make the metal mask with corresponding shapes, and there are some problems, such as easy deformation of the opening of the metal mask, difficulty in precise size control, and inability of simultaneous formation. Therefore, it is difficult to realize a film layer shape with accurate control of a plane size.

SUMMARY

An embodiment of the present disclosure provides a display substrate, the display substrate comprises a driving circuit layer provided on a base substrate and a light emitting structure layer provided on a side of the driving circuit layer away from the base substrate, the driving circuit layer includes a pixel driving circuit, the light emitting structure layer includes an OLED device connected with the pixel driving circuit, the OLED device includes an anode, a light emitting functional layer, and a cathode stacked sequentially, and the light emitting functional layer includes multiple film layers which are stacked; the light emitting structure layer includes an anode layer, a first film layer group, and a second film layer group stacked sequentially, wherein the anode layer includes one or more anodes, the first film layer group includes at least one film layer of the light emitting functional layer, and the second film layer group includes at least one film layer of the light emitting functional layer and the cathode; an orthographic projection of the second film layer group on the base substrate contains an orthographic projection of the first film layer group on the base substrate, an overlapping portion of all film layers in the first film layer group serves as a first portion of the first film layer group, an orthographic projection region of a part of the first portion of the first film layer group covering a surface of the anode and directly contacting the anode surface on the base substrate is a light emitting region of the display substrate, and an orthographic projection region of a portion of the second film layer group that is not overlapped with the first portion of the first film layer group on the base substrate is configured not to emit light; a distance between an edge of the first film layer group and an edge of the second film layer group is different at multiple positions.

An embodiment of the present disclosure further provides a display panel, including the display substrate according to any embodiment.

An embodiment of the present disclosure further provides a display device, including the display substrate according to any embodiment.

An embodiment of the present disclosure further provides a method for manufacturing a display substrate, wherein the display substrate includes an OLED device, the OLED device includes an anode, a light emitting functional layer and a cathode stacked sequentially, and the light emitting functional layer includes multiple stacked film layers, and the method includes:
- forming a driving circuit layer on a base substrate, and the driving circuit layer includes a pixel driving circuit;
- forming an anode layer on a side of the driving circuit layer away from the base substrate, and the anode layer includes one or more anodes;
- forming a first film layer group on a surface of the anode facing away from the base substrate, and the first film layer group includes at least one film layer of the light emitting functional layer;
- forming a second film layer group on a surface of the first film layer group facing away from the base substrate, and the second film layer group includes at least one film layer of the light emitting functional layer and the cathode;
- wherein an orthographic projection of the second film layer group on the base substrate contains an orthographic projection of the first film layer group on the base substrate, an overlapping portion of all film layers in the first film layer group serves as a first portion of the first film layer group, an orthographic projection region of a part of the first portion of the first film layer group covering a surface of the anode and directly contacting the surface of the anode on the base substrate is a light emitting region of the display substrate, and an orthographic projection region of a portion of the second film layer group that is not overlapped with the first portion of the first film layer group on the base substrate is configured not to emit light; a distance between an edge of the first film layer group and an edge of the second film layer group is different at multiple positions.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
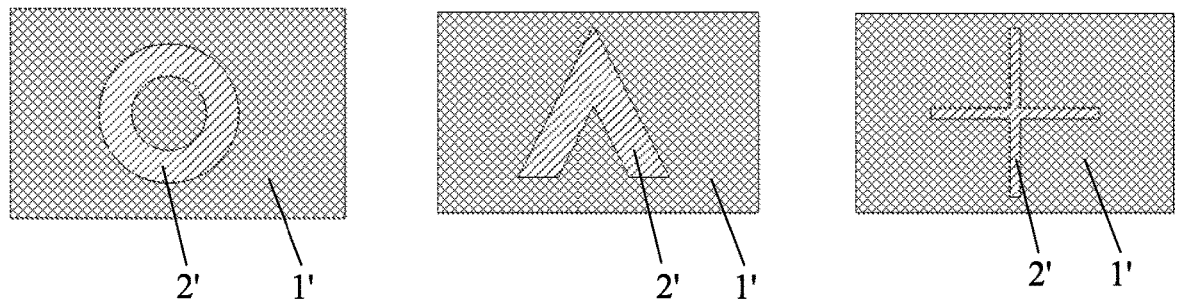
FIG. 1 is a schematic diagram of substrates of some light emitting regions with different shapes.
Figure 2:
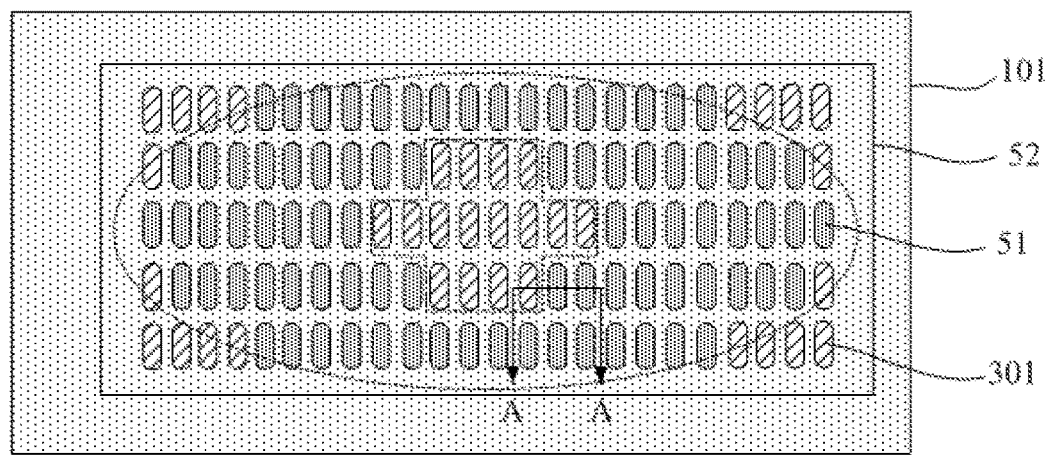
FIG. 2 is a schematic diagram of a planar structure of a display substrate in some exemplary embodiments.
Figure 3:
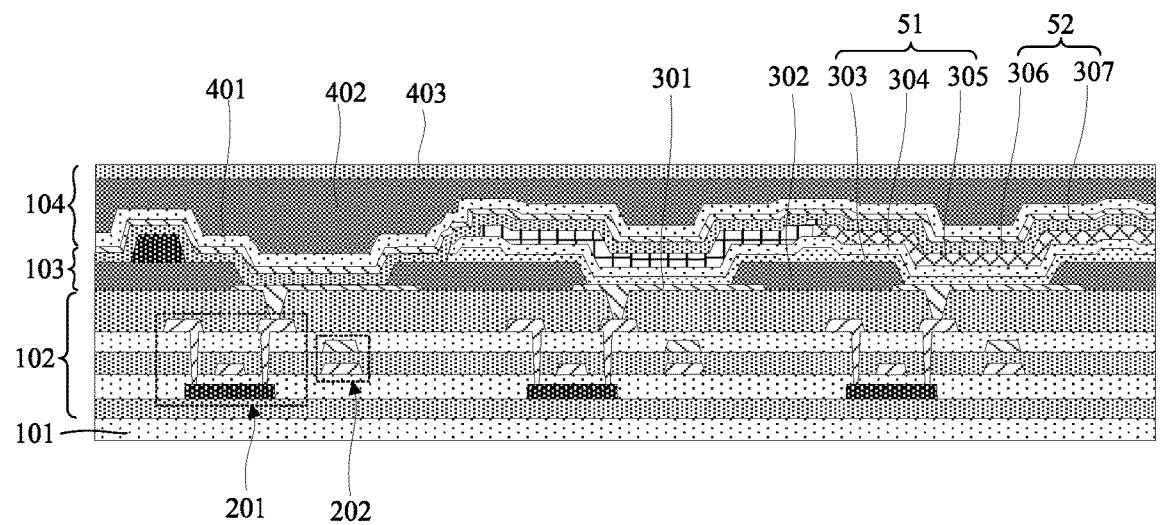
FIG. 3 is a schematic diagram of a cross-sectional structure taken along A-A in FIG. 2 in some exemplary embodiments.

An embodiment of the present disclosure provides a display substrate, in some exemplary embodiments, as shown in FIG. 2 and FIG. 3, FIG. 2 is a schematic diagram of a planar structure of a display substrate in some exemplary embodiments, FIG. 3 is a schematic diagram of a cross-sectional structure taken along A-A in FIG. 2 in some exemplary embodiments. The display substrate includes: a driving circuit layer 102 provided on a base substrate 101 and a light emitting structure layer 103 provided on a side of the driving circuit layer 102 away from the base substrate 101. The driving circuit layer 102 includes a pixel driving circuit, the light emitting structure layer 103 includes an OLED device connected with the pixel driving circuit. The OLED device includes an anode 301, a light emitting functional layer and a cathode 307 stacked sequentially, and the light emitting functional layer includes multiple stacked film layers. The light emitting structure layer 103 includes an anode layer, a first film layer group 51, and a second film layer group 52 stacked sequentially. The anode layer includes one or more anodes 301, the first film layer group 51 includes at least one film layer of the light emitting functional layer, and the second film layer group 52 includes at least one film layer of the light emitting functional layer and the cathode 307. An orthographic projection of the second film layer group 52 on the base substrate 101 contains an orthographic projection of the first film layer group 51 on the base substrate 101. An overlapping portion of all the film layers in the first film layer group 51 is a first portion of the first film layer group 51, an orthographic projection region of a part of the first portion of the first film layer group 51 which covers a surface of the anode 301 and is in direct contact with a surface of the anode 301 on the base substrate 101 is a light emitting region of the display substrate. An orthographic projection region of a portion of the second film layer group 52 that is not overlapped with the first portion of the first film layer group 51 on the base substrate 101 is configured not to emit light. A distance between an edge of the first film layer group 51 and an edge of the second film layer group 52 is different at multiple positions.

In an embodiment of the present disclosure, the light emitting region of the display substrate can be understood as a display region of the display substrate, and the shape of the light emitting region can be understood as a shape of the display region of the display substrate. In an example, as shown in FIG. 2, the light emitting region of the display substrate is approximately a region left after the region surrounded by the dashed line in the middle is removed from the dashed line elliptical region. In an embodiment of the present disclosure, a shape of the first portion of the first film layer group 51 may be provided as any desired shape, an edge profile shape of the first film layer group 51 may be a regular shape or an irregular shape, and an edge profile shape of the second film layer group 52 may be a regular shape.

In the display substrate of an embodiment of the present disclosure, the light emitting structure layer 103 includes the anode layer, the first film layer group 51 and the second film layer group 52 stacked sequentially. The anode layer includes one or more anodes 301, the first film layer group 51 includes at least one film layer in the OLED device located between the anode 301 and the cathode 307, the second film layer group 52 includes a cathode 307, and at least one film layer in the OLED device located between the anode 301 and the cathode 307. The orthographic projection of the second film layer group 52 on the base substrate 101 contains the orthographic projection of the first film layer group 51 on the base substrate 101. The overlapping portion of all the film layers in the first film layer group 51 is as the first portion of the first film layer group 51. The orthographic projection region of the part of the first portion of the first film layer group 51 which covers the surface of the anode 301 (herein, the surface of the anode 301 refers to a surface of the anode 301 facing away from the base substrate) and is in direct contact with the surface of the anode 301 on the base substrate 101 is the light emitting region of the display substrate. The orthographic projection region of the portion of the second film layer group 52 that is not overlapped with the first portion of the first film layer group 51 on the base substrate is configured not to emit light, thus, the shape of the light emitting region of the display substrate may be defined by defining the shape of the first portion of the first film layer group 51. When the shape of the light emitting region of the display substrate is an irregular pattern, it is only necessary to manufacture the shape of the first portion of the first film layer group 51 into a corresponding irregular pattern, so that there is no need to manufacture the shape of the film layers of the second film layer group 52 into a corresponding irregular pattern. A difficulty of manufacturing the second film layer group 52 is reduced, in addition, a material of the film layers of the first film layer group 51 may be selected as a material which can be prepared by a film formation process other than an evaporation process, thereby manufacturing of a film layer pattern which is difficult to be formed by the evaporation process can be achieved, the difficulty of manufacturing the light emitting structure layer 103 can be reduced, and a pattern of the light emitting region which is difficult to be formed by the evaporation process alone can be formed more conveniently.

In some exemplary embodiments, the light emitting functional layer includes a light emitting layer, and any one or more of the following film layers: a hole injection layer, a hole transport layer, an electron block layer, a hole block layer, an electron transport layer, and an electron injection layer.

In an example of this embodiment, the light emitting functional layer may include a hole injection layer, a hole transport layer, an electron block layer, a light emitting layer, a hole block layer, an electron transport layer, and an electron injection layer stacked sequentially along a direction away from the anode. In an embodiment of the present disclosure, film layers of the first film layer group and remaining film layers of the second film layer group except the cathode are provided sequentially according to the stacking order of the film layers involved in the light emitting functional layer in this embodiment.

In some exemplary embodiments, the first film layer group or the second film layer group includes the light emitting layer.

In some exemplary embodiments, the first film layer group may include any one or more of the hole injection layer, the hole transport layer, and the electron block layer.

In some exemplary embodiments, the second film layer group may include any one or more of the hole block layer, the electron transport layer, and the electron injection layer.

In some exemplary embodiments, the first film layer group may include the light emitting layer, and further include any one or more of the hole injection layer, the hole transport layer, the electron block layer, the hole block layer, and the electron transport layer. In an example of this embodiment, the second film layer group may include the electron injection layer and the cathode.

Exemplary, as shown in FIG. 3, in the light emitting structure layer 103, the first film layer group 51 may include the hole injection layer 303, the hole transport layer 304, and the light emitting layer 305 stacked sequentially in the direction away from the anodes 301, and the second film layer group 52 may include the electron injection layer 306 and the cathode 307 stacked sequentially in a direction away from the light emitting layer 305. Three anodes are shown in FIG. 3, the first film layer group 51 is not provided on a surface of a left anode 301, and the second film layer group 52 directly covers the surface of the left anode 301, so a region where the left anode 301 is located does not emit light. If a middle anode 301 and a right anode 301 are sequentially covered by all the film layers of the first film layer group 51 and all the film layers of the second film layer group 52, then a region where the middle anode 301 and the right anode 301 are located may emit light. In an embodiment of the present disclosure, film layer structures of the first film layer group 51 and the second film layer group 52 may be designed in advance, and the OLED device in the light emitting structure layer 103 may be configured not to emit light when any one film layer or more film layers of the first film layer group 51 and the second film layer group 52 are absent.

In some exemplary embodiments, the first film layer group may include the hole injection layer, the hole transport layer, the electron block layer, and the light emitting layer stacked sequentially in the direction away from the anode. The second film layer group may include the hole block layer, the electron transport layer, the electron injection layer, and the cathode stacked sequentially in the direction away from the light emitting layer.

In some exemplary embodiments, a thickness of the first film layer group may be 10 nm to 300 nm. Exemplarily, the first film layer group may include the hole injection layer, the hole transport layer, and the light emitting layer stacked sequentially in the direction away from the anode, wherein a total thickness of the hole injection layer, the hole transport layer, and the light emitting layer may be 10 nm to 300 nm.

In some exemplary embodiments, the light emitting structure layer may include multiple OLED devices emitting light of multiple of colors (which may include red, green, and blue for example), then the light emitting region can display color images; alternatively, the light emitting structure layer may include one OLED device that emits light of a set color, and the light emitting region may emit light of the set color.

In some exemplary embodiments, the first film layer group may include two or more of film layers, and orthographic projections of any two film layers of the first film layer groups on the base substrate contain orthographic projections of the anodes on the base substrate of the same number and position. In this embodiment, orthographic projection regions of any two film layers in the first film layer group on the base substrate are approximately the same, and a planar shape of the first film layer group is approximately the same as the shape of the light emitting region of the display substrate.

In some exemplary embodiments, as shown in FIG. 2, a part of a portion of the second film layer group 52 that is not overlapped with the first film layer group 51 covers a surface of the anode 301. In this embodiment, the first film layer group 51 or the second film layer group 52 includes the light emitting layer. In some examples of this embodiment, the second film layer group 52 includes the light emitting layer, a portion of the second film layer group 52 may be directly cover surfaces of the anodes 301, for example, in the example as shown in FIG. 2, a portion of the second film layer group 52 directly covers the surfaces of 16 anodes 301 in the region surrounded by the dashed line inside the dashed line ellipse, but an orthographic projection region of the portion of the second film layer group 52 directly covering the surfaces of the anodes 301 on the base substrate 101 may be configured not to emit light.

In some exemplary embodiments, a film surface of the first film layer group is continuous or discontinuous. Exemplarily, the first portion of the first film layer group may be in an integral structure, or the first portion of the first film layer group may include multiple independent and unconnected sub-regions. In this embodiment, if the film surface of the first film layer group is continuous, then the formed light emitting region may be understood as a continuous light emitting region, and if the film surface of the first film layer group is discontinuous, then the formed light emitting region may be understood as including multiple discontinuous sub-light emitting regions.

Figure 6:
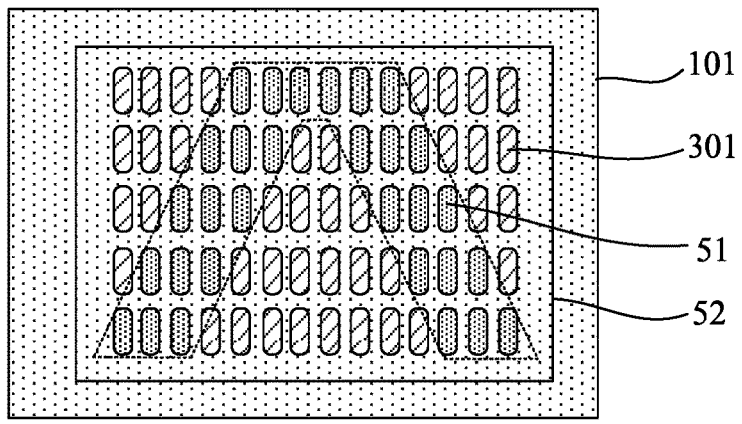
FIG. 6 is a schematic diagram of a planar structure of a display substrate in some other exemplary embodiments.
Figure 7:
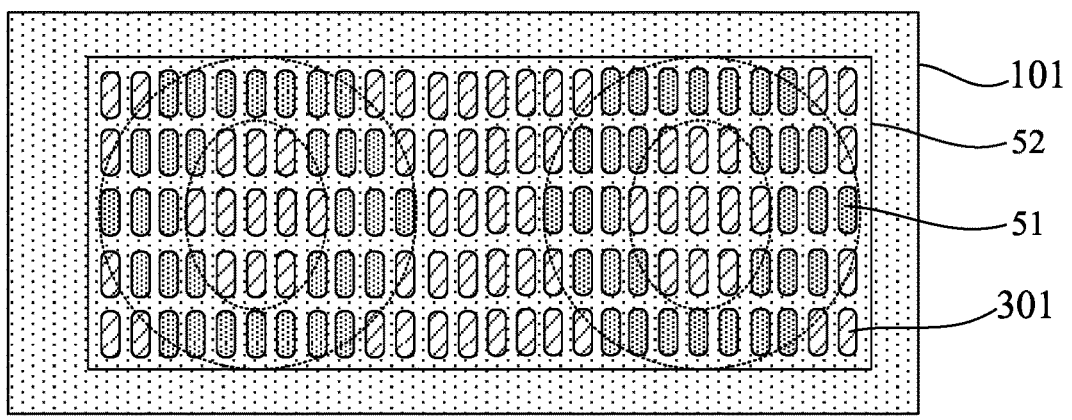
FIG. 7 is a schematic diagram of a planar structure of a display substrate in some further exemplary embodiments.

Exemplarily, as shown in FIG. 2, in this example, the film surface of the first film layer group 51 is continuous, and the light emitting region of the display substrate is substantially a region left after the region surrounded by the dashed line in the middle is removed from the dashed line elliptical region, and the shape of the light emitting region is substantially the same as the planar shape of the first film layer group 51. In some other examples, as shown in FIG. 6, in this example, the film surface of the first film layer group 51 is continuous, and the light emitting region of the display substrate is approximately an inverted V-shaped region surrounded by dashed lines, and the shape of the light emitting region is approximately the same as the planar shape of the first film layer group 51. In some other examples, as shown in FIG. 7, in this example, the film surface of the first film layer group 51 is discontinuous, exemplarily, the planar shape of the first film layer group 51 is two circular rings, the shape of the light emitting region is approximately the same as the planar shape of the first film layer group, and the light emitting region of the display substrate is approximately two circular ring regions surrounded by dashed lines. As shown in FIG. 2, FIG. 6 and FIG. 7, in some examples, an edge of the first film layer group 51 may be an edge of the light emitting region of the display substrate.

Figure 8:
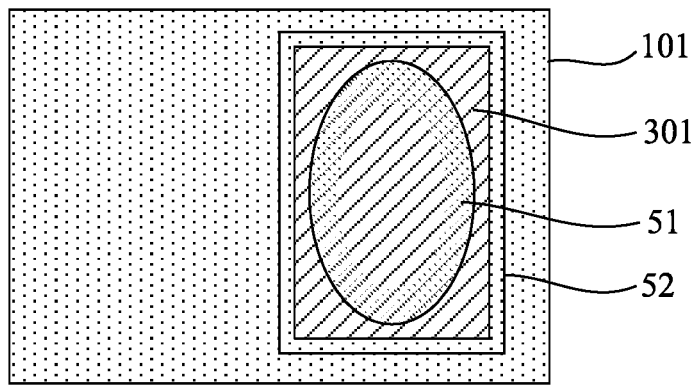
FIG. 8 is a schematic diagram of a planar structure of a display substrate in some further exemplary embodiments.

In some exemplary embodiments, as shown in FIG. 8, the light emitting structure layer may include one OLED device, and the first film layer group 51 may be formed on the surface of the anode 301. The orthographic projection of the anode 301 on the base substrate 101 may contain the orthographic projection of the first film layer group 51 on the base substrate 101, and the orthographic projection of the second film layer group 52 on the base substrate 101 may contain the orthographic projection of the anode 301 on the base substrate 101. In the example as shown in FIG. 8, the film surface of the first film layer group 51 is continuous and annular, the light emitting region of the display substrate is the region where the first film layer group 51 is located, and the light emitting region of the display substrate is annular.

In some exemplary embodiments, the film layers of the first film layer group may be formed using any one or more process(es) of inkjet printing, spraying, in-situ growth, exposure development, and laser ablation, and the manufacturing of film layers of multiple patterns is easier than an evaporation process, and sizes of the film layers are easier to be controlled.

In an example of this embodiment, the material of the film layers of the first film layer group may be an organic material, such as an aromatic organic small molecule, a metal organic complex, a conjugated polymer material, or the like; alternatively, the material of the film layers of the first film layer group may be an inorganic material such as an amorphous metal oxide, sulfide, or inorganic nanoparticles, or the like.

In some exemplary embodiments, any one film layer of the second film layer group may be in an integrated structure. A manufacturing process of the film layers of the second film layer group may not be limited, for example, a process having a solid-gas phase transition process such as evaporation or chemical vapor deposition may be adopted. In an example of this embodiment, a material of film layers other than the cathode in the second film layer group may be an organic material or an inorganic material, for example, may include a metal oxide, a halide, a metal, or the like.

In an example of this embodiment, a shape of the film layers of the second film layer group may not be limited, and the shape of the film layers of the second film layer group may not be related to the shape of the film layers of the first film layer group. The second film layer group may completely cover the first film layer group, and a minimum distance by which an edge of the second film layer group protrudes from an edge of the first film layer group may be more than 2 times of a position accuracy value of the film formation process of the film layers of the second film layer group.

In some exemplary embodiments, as shown in FIG. 3, an active matrix (AM) driving mode may be used for the pixel driving circuit of the driving circuit layer, and the pixel driving circuit may include multiple thin film transistors and a storage capacitor. FIG. 3 schematically shows one drive transistor 201 and one storage capacitor 202, and each pixel driving circuit drives one corresponding OLED device to emit light. In some other implementations, the pixel driving circuit of the driving circuit layer may employ a passive matrix (PM) driving mode. Exemplarily, the driving circuit layer 102 may include: a first insulation layer provided on the base substrate 101; an active layer provided on the first insulation layer; a second insulation layer covering the active layer; a gate electrode and a first capacitance electrode provided on the second insulation layer; a third insulation layer covering the gate electrode and the first capacitance electrode; a second capacitance electrode provided on the third insulation layer; a fourth insulation layer covering the second capacitance electrode, vias being provided on the second insulation layer, the third insulation layer, and the fourth insulation layer and exposing the active layer; a source electrode and a drain electrode arranged on the fourth insulation layer, with the source electrode and the drain electrode being respectively connected with the active layer through two vias that pass through the fourth insulation layer, the third insulation layer, and the second insulation layer; and a planarization layer covering the aforementioned structure, vias being provided on the planarization layer and exposing the drain electrode. Among them, the active layer, the gate electrode, the source electrode, and the drain electrode constitute the drive transistor 201 of the pixel driving circuit, and the first capacitor electrode and the second capacitor electrode constitute the storage capacitor 202 of the pixel driving circuit.

In some exemplary embodiments, as shown in FIG. 3, the light emitting structure layer 103 may further include a pixel definition layer 302 provided on a side of the anode layer facing away from the base substrate 101. The pixel definition layer 302 is provided with a pixel opening, the pixel definition layer 302 covers a portion of the surface of the anode 301 close to a circumferential edge thereof. The pixel opening exposes the remaining portion of the surface of the anode 301, the first film layer group 51 and the second film layer group 52 are sequentially stacked on the portion of the surface of the anode 301 exposed by the pixel opening, thereby forming an OLED device. The light emitting structure layer 103 may further include other film layers, e.g., post spacers and the like provided on the pixel definition layer 302.

In an example of this embodiment, the pixel definition layer 302 may include multiple first partition sections extending along a first direction and multiple second partition sections extending along a second direction. The multiple first partition sections and the multiple second partition sections intersect with each other to define multiple pixel openings, and the pixel openings expose the surface of the anode 301. A thickness of the first partition sections may be greater than a thickness of the second partition sections, and the first film layer group 51 may be partitioned by the first partition section. The first film layer group 51 may not be partitioned by the second partition section. A width of a first partition section in the second direction is larger than or equal to 10 microns. A width of a second partition section in the first direction is larger than or equal to 20 microns. The pixel definition layer 302 may be formed by a one-step or two-step exposure development process.

In an example of this embodiment, the first portion of the first film layer group at least has a first film thickness and a second film thickness, and the first film thickness is greater than the second film thickness. A part of the first portion of the first film layer group covering the second partition section has the first film thickness, and a part of the first portion of the first film layer group covering the surface of the anode and directly contacting the surface of the anode has the second film thickness. Exemplarily, the anode is connected with a drain electrode of a thin film transistor in the driving circuit layer through an anode via provided in the driving circuit layer. An orthographic projection of a second partition section on the base substrate may contain an orthographic projection of the anode via on the base substrate. Pits may be formed on a surface of a portion of the second partition section corresponding to a position of the anode via facing away from the base substrate. A thickness of a part of the first portion of the first film layer group corresponding to a pit position is the first film thickness, and a thickness of a part of the first portion of the first film layer group covering the surface of the anode and directly contacting the surface of the anode is the second film thickness. Exemplarily, the film layers of the first film layer group may be formed using an ink jet printing process.

In some exemplary embodiments, as shown in FIG. 3, the display substrate may further include an encapsulation structure layer 104 provided on a side of the light emitting structure layer 103 away from the base substrate 101. The encapsulation structure layer 104 may include a first encapsulation layer 401, a second encapsulation layer 402, and a third encapsulation layer 403 stacked sequentially. The first encapsulation layer 401 and the third encapsulation layer 403 may be made of an inorganic material, and the second encapsulation layer 402 may be made of an organic material, in this way, it can be effectively ensured that external moisture cannot enter the light emitting structure layer 103. The display substrate may also include other film layers provided on a side of the encapsulation structure layer 104 away from the base substrate, for example, a touch structure layer, a light extraction layer, and the like may be included.

A method for manufacturing the display substrate of an embodiment of the present disclosure will be described below with reference to FIG. 2 to FIG. 5b, wherein the display substrate includes an OLED device, the OLED device includes an anode, a light emitting functional layer and a cathode stacked sequentially, and the light emitting functional layer includes stacked multiple film layers. In some exemplary implementations, a manufacturing process of the display substrate may include the following operations.

Figure 4A:
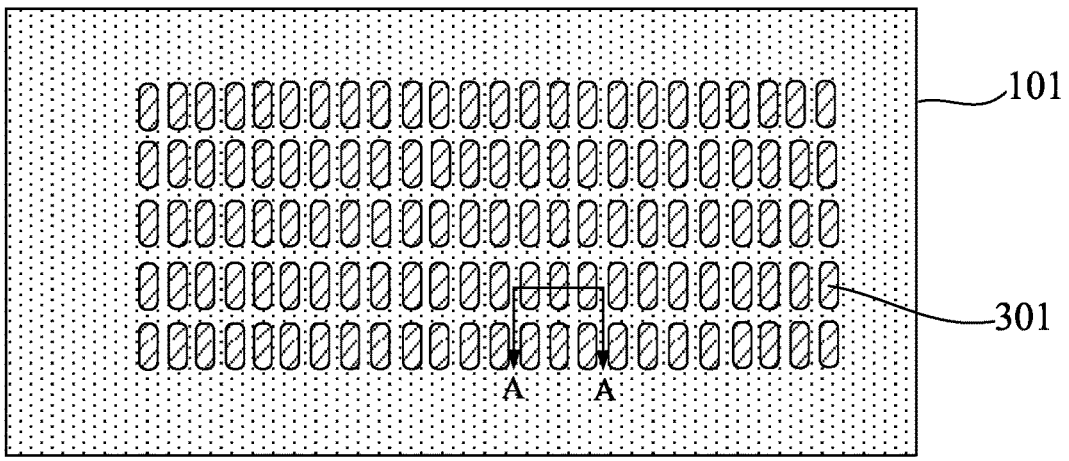
FIG. 4a is a schematic diagram of a planar structure after a driving circuit layer and post spacers are formed on a base substrate in some exemplary embodiments.
Figure 4B:
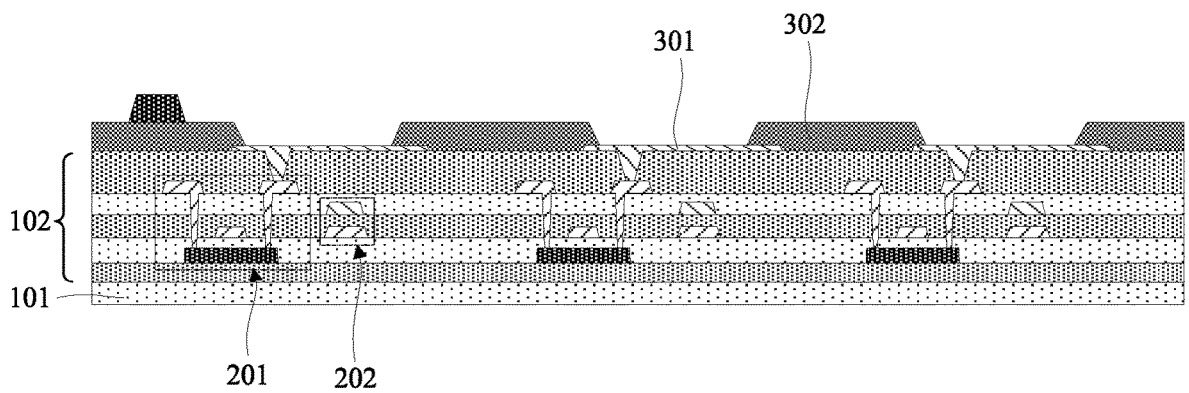
FIG. 4b is a schematic diagram of a cross-sectional structure taken along A-A in FIG. 4a in some exemplary embodiments.

1) A driving circuit layer 102 is formed on a base substrate 101, the driving circuit layer 102 includes a pixel driving circuit. Exemplarily, as shown in FIG. 4b, a manufacturing process of the driving circuit layer 102 may include:

Depositing a first insulation thin film and an active layer thin film sequentially on a base substrate 101, and patterning the active layer thin film by a patterning process to form a first insulation layer covering the base substrate 101 and a pattern of an active layer provided on the first insulation layer, wherein the pattern of the active layer at least includes an active layer of each sub-pixel.

Then, depositing a second insulation thin film and a first metal thin film sequentially, and patterning the first metal thin film by a patterning process to form a second insulation layer covering the pattern of the active layer and a pattern of a first gate metal layer provided on the second insulation layer, wherein the pattern of the first gate metal layer at least includes a gate electrode and a first capacitance electrode of each sub-pixel.

Then, depositing a third insulation thin film and a second metal thin film sequentially, and patterning the second metal thin film by a patterning process to form a third insulation layer covering the first gate metal layer and a pattern of a second gate metal layer provided on the third insulation layer. The pattern of the second gate metal layer includes at least a second capacitance electrode of each sub-pixel, and a position of the second capacitance electrode corresponds to that of the first capacitance electrode. The first capacitance electrode and the second capacitance electrode constitute a storage capacitor 202.

Then, depositing a fourth insulation thin film, and patterning the fourth insulation thin film by a patterning process to form a pattern of a fourth insulation layer covering the second gate metal layer, wherein the fourth insulation layer of each sub-pixel is provided with at least two vias, the fourth insulation layer, the third insulation layer and the second insulation layer in the two vias are etched away to expose a surface of the active layer of each sub-pixel.

Then, depositing a third metal thin film, and patterning the third metal thin film by a patterning process to form a pattern of a source-drain metal layer on the fourth insulation layer, wherein the source-drain metal layer at least includes a source electrode and a drain electrode of each sub-pixel, and the source electrode and the drain electrode are respectively connected to the active layer through the two vias penetrating the fourth insulation layer, the third insulation layer and the second insulation layer.

Then, coating a planarization thin film of an organic material on the base substrate 101 on which the aforementioned patterns are formed, and forming a via on the planarization thin film of each sub-pixel by processes such as masking, exposing and developing, wherein the planarization thin film in the via is developed away to expose a surface of the drain electrode, thereby forming a planarization layer (PLN) covering the base substrate 101.

At this point, the driving circuit layer 102 has been manufactured on the base substrate 101, as shown in FIG. 4b. In the driving circuit layer 102, the active layer, the gate electrode, the source electrode, and the drain electrode constitute the drive transistor 201 of the pixel driving circuit, and the first capacitance electrode and the second capacitance electrode constitute the storage capacitor 202 of the pixel driving circuit. The pixel driving circuit may drive the OLED device of each sub-pixel in an active matrix driving mode.

In this example, the first insulation layer, the second insulation layer, the third insulation layer, and the fourth insulation layer may be made of any one or more of silicon oxide (SiOx), silicon nitride (SiNx), and silicon oxynitride (SiON), and may be in a single layer, multiple layers, or a composite layer. The first insulation layer may be called a buffer layer, which is used for improving water and oxygen resistance capability of the base substrate 101. The second insulation layer and the third insulation layer may be called gate insulation (GI) layers. The fourth insulation layer may be called an interlayer dielectric (ILD) layer. The first metal thin film, the second metal thin film and the third metal thin film may be made of metal materials, such as any one or more of silver (Ag), copper (Cu), aluminum (Al), titanium (Ti) and molybdenum (Mo), or an alloy material of the aforementioned metals, such as aluminum neodymium alloy (AlNd) or molybdenum niobium alloy (MoNb), and may be in a single-layered structure or a multilayered composite structure, such as Ti/Al/Ti, etc. The active layer thin film may be made of amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, or other materials.

2) An anode layer is formed on a side of the driving circuit layer 102 away from the base substrate 101, and the anode layer includes one or more anodes 301, as shown in FIG. 4b. Exemplarily, an anode thin film is deposited on the base substrate 101 on which the aforementioned patterns are formed, and the anode thin film is patterned by a patterning process to form an anode layer including multiple anodes 301. The anodes 301 are formed on the planarization layer of the driving circuit layer 102 and is connected to the drain electrode of the drive transistor 201 through a via on the planarization layer.

3) A pixel definition layer and post spacers are formed, as shown in FIG. 4b. A pixel definition thin film is coated on the base substrate 101 on which the aforementioned patterns are formed, and the pixel definition layer 302 with a pixel opening is formed by masking, exposing, developing, and other processes, wherein the pixel definition thin film in the pixel opening is developed away to expose a surface of a corresponding anode 301, and the pixel definition layer 302 covers a portion of a surface of the anode 301 close to the circumferential edge, as shown in FIG. 4a. A material of the pixel definition layer 302 may be polyimide, acrylic, polyethylene terephthalate, or the like. Subsequently, post spacers (PS) may be formed on the pixel definition layer 302.

Figure 5A:
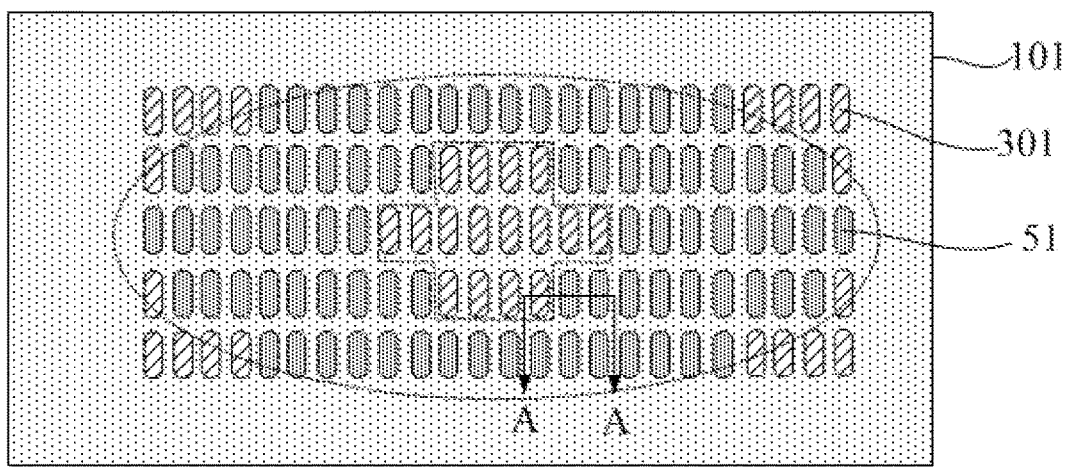
FIG. 5a is a schematic diagram of a planar structure after a first film layer group is formed on an anode in some exemplary embodiments.
Figure 5B:
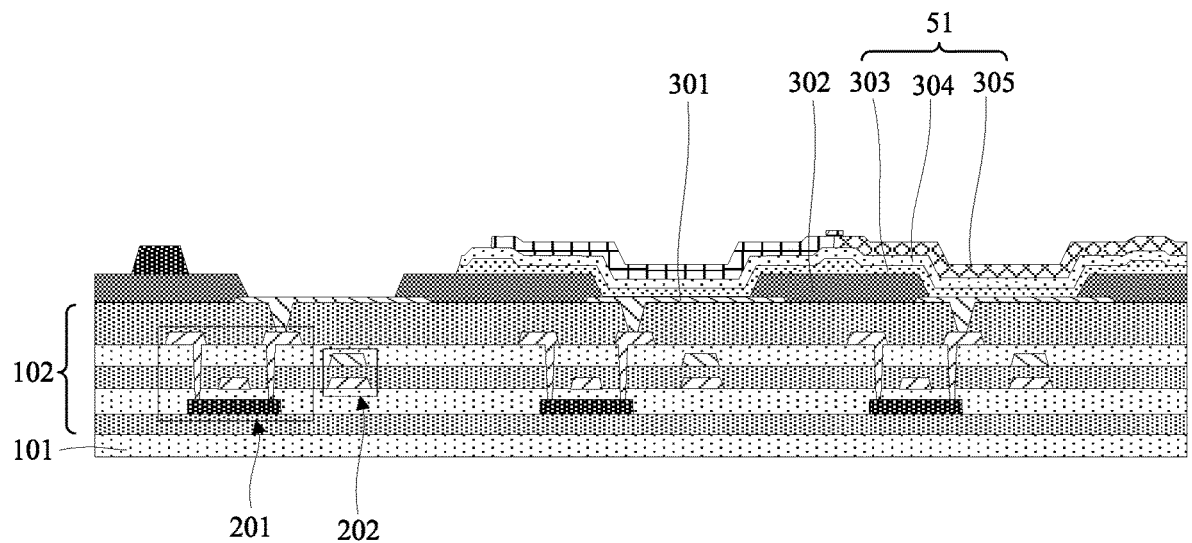
FIG. 5b is a schematic diagram of a cross-sectional structure taken along A-A in FIG. 5a in some exemplary embodiments.

4) A first film layer group 51 is formed on a surface of the anode 301 facing away from the base substrate 101, the first film layer group 51 includes at least one film layer of the light emitting functional layer, as shown in FIG. 5a and FIG. 5b, and, Exemplarily, a hole injection layer 303, a hole transport layer 304, and a light emitting layer 305 are sequentially formed on a surface of the anode 301 in a set region, wherein the hole injection layer 303, the hole transport layer 304, and the light emitting layer 305 serve as the first film layer group 51. In the example as shown in FIG. 5b, three anodes 301 are shown, the film layers of the first film layer group 51 are not formed on a surface of a left anode 301, and a middle anode 301 and a right anode 301 are covered by all the film layers of the first film layer group 51. Among them, the hole injection layer 303, the hole transport layer 304, and the light emitting layer 305 may be formed by any one or more processes of ink jet printing, spraying, in-situ growth, exposure development, and laser ablation.

5) A second film layer group 52 is formed on a surface of the first film layer group 51 facing away from the base substrate 101, the second film layer group 52 includes at least one film layer of the light emitting functional layer and the cathode 307. As shown in FIG. 2 and FIG. 3, an electron injection layer 306 and a cathode 307 are sequentially formed on the surface of the first film layer group 51. The electron injection layer 306 and the cathode 307 serve as the second film layer group 52, and the electron injection layer 306 and the cathode 307 completely cover the first film layer group 51. The electron injection layer 306 and the cathode 307 may both have an integral structure, the electron injection layer 306 and the cathode 307 may be formed by a process, such as an evaporation process, a chemical vapor deposition process, or the like, and the manufacturing process of the electron injection layer 306 and the cathode 307 is not limited in this example. At this point, the manufacturing of the light emitting structure layer 103 has been completed.

Herein, an orthographic projection of the second film layer group 52 on the base substrate 101 contains an orthographic projection of the first film layer group 51 on the base substrate 101, that is, the first film layer group 52 is completely covered by the second film layer group 51, an overlapping portion of all the film layers in the first film layer group 51 serves as a first portion of the first film layer group 51, an orthographic projection region of a part of the first portion of the first film layer group 51 covering a surface of the anode 301 on the base substrate 101 is a light emitting region of the display substrate, and an orthographic projection region of a portion of the second film layer group 52 that is not overlapped with the first portion of the first film layer group 51 on the base substrate 101 is configured not to emit light. As shown in FIG. 3, three anodes 301 are exemplarily shown, since the first film layer group 51 is not formed on the surface of the left anode 301, the second film layer group 52 directly covers the surface of the left anode 301, and a region where the left anode 301 is located does not emit light. The first film layer group 51 of the middle anode 301 and the right anode 301 is covered by the second film layer group 52, and a region where the middle anode 301 and the right anode 301 are located emits light.

6) An encapsulation structure layer 104 is formed on a surface of the light emitting structure layer 103 facing away from the base substrate 101, as shown in FIG. 3, exemplarily, a first encapsulation layer 401, a second encapsulation layer 402, and a third encapsulation layer 403 are sequentially formed on the surface of the light emitting structure layer 103 facing away from the base substrate 101, the first encapsulation layer 401 and the third encapsulation layer 403 may be made of an inorganic material, and the second encapsulation layer 402 may be made of an organic material. The first encapsulation layer 401 and the third encapsulation layer 403 completely wrap the second encapsulation layer 402, thus effectively preventing water and oxygen from intruding into the light emitting structure layer 103.

Based on the above contents, an embodiment of the present disclosure further provides a method for manufacturing a display substrate, wherein the display substrate includes an OLED device. The OLED device includes an anode, a light emitting functional layer and a cathode stacked sequentially, and the light emitting functional layer includes multiple stacked film layers, and the method includes:

forming a driving circuit layer on a base substrate, and the driving circuit layer includes a pixel driving circuit;

an anode layer is formed on a side of the driving circuit layer away from the base substrate, and the anode layer includes one or more anodes;

forming a first film layer group on a surface of the anode facing away from the base substrate, and the first film layer group includes at least one film layer of the light emitting functional layer;

forming a second film layer group on a surface of the first film layer group facing away from the base substrate, and the second film layer group includes at least one film layer of the light emitting functional layer and the cathode;

wherein an orthographic projection of the second film layer group on the base substrate contains an orthographic projection of the first film layer group on the base substrate, an overlapping portion of all film layers in the first film layer group serves as a first portion of the first film layer group, an orthographic projection region of a portion of the first portion of the first film layer group covering a surface of the anode and directly contacting the surface of the anode on the base substrate is a light emitting region of the display substrate, and an orthographic projection region of a portion of the second film layer group 52 that is not overlapped with the first portion of the first film layer group 51 on the base substrate 101 is configured not to emit light; a distance between an edge of the first film layer group and an edge of the second film layer group is different at multiple positions.

In some exemplary embodiments, the film layers of the first film layer group are formed using any one or more processes of inkjet printing, spraying, in-situ growth, exposure development, and laser ablation.

In some exemplary embodiments, any one film layer of the second film layer group is in an integral structure, and the film layers of the second film layer group are formed by an evaporation process or a chemical vapor deposition process.

An embodiment of the present disclosure further provides a display panel, which includes the display substrate according to any one of the previous embodiments. Exemplarily, the display panel may further include a polarizer and a cover plate that are sequentially stacked on a side of the encapsulation structure layer of the display substrate facing away from the base substrate. In other implementations, the display panel may further include a touch control structure layer provided between the encapsulation structure layer and the polarizer.

An embodiment of the present disclosure further provides a display device, which includes the display substrate according to any one of the previous embodiments. The display device may be any product or component with a display function, such as a mobile phone, a tablet computer, a television, a display, a laptop computer, a digital photo frame, and a navigator.

In the accompanying drawings, a size of a constituent element, and a thickness of a layer or a region are sometimes exaggerated for clarity. Therefore, an implementation of the present disclosure is not necessarily limited to the size, and the shape and size of each component in the drawings do not reflect an actual scale. In addition, the drawings schematically illustrate some examples, and an implementation of the present disclosure is not limited to the shapes or numerical values shown in the drawings.

In the description herein, "parallel" refers to a state in which an angle formed by two straight lines is above $-10°$ and below $10°$, and thus also includes a state in which the angle is above $-5°$ and below $5°$. In addition, "vertical" refers to a state in which an angle formed by two straight lines is above $80°$ and below $100°$, and thus also includes a state in which the angle is above $85°$ and below $95°$.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or an internal communication between two components. For those ordinarily skilled in the art, meanings of the above terms in the embodiments of the present disclosure may be understood according to situations.

The invention claimed is:

1. A display substrate, comprising a driving circuit layer provided on a base substrate and a light emitting structure layer provided on a side of the driving circuit layer away from the base substrate, wherein the driving circuit layer comprises a pixel driving circuit, the light emitting structure layer comprises an organic light emitting diode (OLED) device connected with the pixel driving circuit, the OLED device comprises an anode, a light emitting functional layer, and a cathode stacked sequentially, and the light emitting functional layer comprises a plurality of film layers which are stacked;

the light emitting structure layer comprises an anode layer, a first film layer group, and a second film layer group stacked sequentially, wherein the anode layer comprises one or more anodes, the first film layer group comprises at least one film layer of the light emitting functional layer, and the second film layer group comprises at least one film layer of the light emitting functional layer and the cathode;

an orthographic projection of the second film layer group on the base substrate contains an orthographic projection of the first film layer group on the base substrate, an overlapping portion of all film layers in the first film layer group serves as a first portion of the first film layer group, an orthographic projection region of a part of the first portion of the first film layer group covering a surface of the anode and directly contacting the surface of the anode on the base substrate is a light emitting region of the display substrate, and an orthographic projection region of a portion of the second film layer group that is not overlapped with the first portion of the first film layer group on the base substrate is configured not to emit light;

a distance between an edge of the first film layer group and an edge of the second film layer group is different at a plurality of positions.

2. The display substrate according to claim 1, wherein the light emitting functional layer comprises a light emitting layer and any one or more of following film layers: a hole injection layer, a hole transport layer, an electron block layer, a hole block layer, an electron transport layer, and an electron injection layer.

3. The display substrate according to claim 2, wherein the first film layer group or the second film layer group comprises the light emitting layer.

4. The display substrate according to claim 2, wherein the first film layer group comprises any one or more of the hole injection layer, the hole transport layer, and the electron block layer.

5. The display substrate according to claim 2, wherein the second film layer group comprises any one or more of the hole block layer, the electron transport layer, and the electron injection layer.

6. The display substrate according to claim 1, wherein the first film layer group comprises two or more film layers, and orthographic projections of any two film layers of the first film layer group on the base substrate contains orthographic projections of the anodes on the base substrate with a same number and same positions.

7. The display substrate according to claim 1, wherein a part of the portion of the second film layer group that is not overlapped with the first film layer group covers the surface of the anode.

8. The display substrate according to claim 1, wherein a film surface of the first film layer group is continuous or discontinuous.

9. The display substrate according to claim 1, wherein any one film layer of the second film layer group is an integrated structure.

10. The display substrate according to claim 1, wherein the film layers of the first film layer group are formed by any one or more processes of ink jet printing, spraying, in-situ growth, exposure development, and laser ablation.

11. The display substrate according to claim 1, wherein the light emitting structure layer further comprises a pixel definition layer provided on a side of the anode layer facing away from the base substrate, the pixel definition layer comprises a plurality of first partition sections extending along a first direction and a plurality of second partition sections extending along a second direction, the plurality of first partition sections and the plurality of second partition sections intersect with each other to define a plurality of pixel openings, and the pixel openings expose the surface of the anode;
a thickness of the first partition sections is greater than a thickness of the second partition sections, and the first film layer group is partitioned by the first partition sections.

12. The display substrate according to claim 11, wherein a width of a first partition section in the second direction is greater than or equal to 10 microns.

13. The display substrate according to claim 11, wherein a width of a second partition section in the first direction is greater than or equal to 20 microns.

14. The display substrate according to claim 11, wherein the first portion of the first film layer group at least has a first film thickness and a second film thickness, and the first film thickness is greater than the second film thickness; and
a part of the first portion of the first film layer group covering the second partition sections has the first film thickness, and the part of the first portion of the first film layer group covering the surface of the anode and directly contacting the surface of the anode has the second film thickness.

15. The display substrate according to claim 1, wherein a thickness of the first film layer group is 10 nm to 300 nm.

16. A display panel, comprising the display substrate according to claim 1.

17. A display device, comprising the display substrate according to claim 1.

18. A method for manufacturing a display substrate, wherein the display substrate comprises an OLED device, the OLED device comprises an anode, a light emitting functional layer and a cathode stacked sequentially, the light emitting functional layer comprises a plurality of stacked film layers, and the method comprises:
forming a driving circuit layer on a base substrate, and the driving circuit layer comprises a pixel driving circuit;
forming an anode layer on a side of the driving circuit layer away from the base substrate, and the anode layer comprises one or more anodes;
forming a first film layer group on a surface of the anode facing away from the base substrate, and the first film layer group comprises at least one film layer of the light emitting functional layer; and
forming a second film layer group on a surface of the first film layer group facing away from the base substrate, and the second film layer group comprises at least one film layer of the light emitting functional layer and the cathode;
wherein an orthographic projection of the second film layer group on the base substrate contains an orthographic projection of the first film layer group on the base substrate, an overlapping portion of all film layers in the first film layer group serves as a first portion of the first film layer group, an orthographic projection region of a part of the first portion of the first film layer group covering a surface of the anode and directly contacting the surface of the anode on the base substrate is a light emitting region of the display substrate, and an orthographic projection region of a portion of the second film layer group that is not overlapped with the first portion of the first film layer group on the base substrate is configured not to emit light; a distance between an edge of the first film layer group and an edge of the second film layer group is different at a plurality of positions.

19. The method for manufacturing the display substrate according to claim 18, wherein the film layers of the first film layer group are formed by any one or more processes of ink jet printing, spraying, in-situ growth, exposure development, and laser ablation.

20. The method for manufacturing the display substrate according to claim 18, wherein any one film layer of the second film layer group is in an integral structure, and film layers of the second film layer group are formed by an evaporation process or a chemical vapor deposition process.

* * * * *